US008829905B2

(12) United States Patent
Davila et al.

(10) Patent No.: US 8,829,905 B2
(45) Date of Patent: Sep. 9, 2014

(54) MAGNETIC RESONANCE IMAGING COMPATIBLE SWITCHED MODE POWER SUPPLY

(75) Inventors: Juan Manuel Rivas Davila, Niskayuna, NY (US); Randall Henry Buchwald, Pewaukee, WI (US)

(73) Assignee: General Electric Company, Niskayuna, NY (US)

( * ) Notice: Subject to any disclaimer, the term of this patent is extended or adjusted under 35 U.S.C. 154(b) by 674 days.

(21) Appl. No.: 12/786,599

(22) Filed: May 25, 2010

(65) Prior Publication Data

US 2011/0291657 A1 Dec. 1, 2011

(51) Int. Cl.
*G01V 3/00* (2006.01)
*G01R 33/36* (2006.01)

(52) U.S. Cl.
CPC .................................... *G01R 33/36* (2013.01)
USPC .......................................................... 324/322

(58) Field of Classification Search
USPC .................................................. 324/300–322
See application file for complete search history.

(56) References Cited

U.S. PATENT DOCUMENTS

| | | | | |
|---|---|---|---|---|
| 5,721,490 | A | 2/1998 | Takano et al. | |
| 6,150,821 | A | 11/2000 | Mori et al. | |
| 7,403,400 | B2 * | 7/2008 | Stanley | 363/16 |
| 7,592,813 | B2 | 9/2009 | Boskamp et al. | |
| 8,013,607 | B2 * | 9/2011 | DeMeester et al. | 324/318 |
| 2009/0195249 | A1 * | 8/2009 | DeMeester et al. | 324/318 |
| 2011/0077504 | A1 * | 3/2011 | Fischer et al. | 600/411 |
| 2012/0268074 | A1 * | 10/2012 | Cooley et al. | 320/130 |
| 2013/0026978 | A1 * | 1/2013 | Cooley et al. | 320/107 |
| 2013/0271066 | A1 * | 10/2013 | Signorelli et al. | 320/107 |
| 2013/0300417 | A1 * | 11/2013 | Malaney et al. | 324/314 |

* cited by examiner

*Primary Examiner* — Dixomara Vargas
(74) *Attorney, Agent, or Firm* — Jenifer E. Haeckl

(57) ABSTRACT

A switched mode power supply (SMPS) employs only energy storage components that are devoid of ferromagnetic materials. The SMPS operates only at switching frequencies such that any potential electromagnetic interference of interest is generated at frequencies appearing only outside the imaging bandwidth of a corresponding magnetic resonance imaging system powered by the SMPS.

7 Claims, 6 Drawing Sheets

MAGNETIC RESONANCE IMAGING COMPATIBLE SWITCHED MODE POWER SUPPLY

BACKGROUND

The invention relates generally to magnetic resonance imaging (MRI) and more particularly to a switched mode power supply (SMPS) that is compatible with MRI.

MRI systems use radio frequency (RF) detectors to amplify minute radio frequency signals emitted by atoms in a human or animal body after being excited by an RF pulse while being subjected to a constant magnetic field. The power distribution architecture found in conventional MRI systems has an intricate array of heavy gauge wires that supply the various voltage and current levels needed across the different MRI subsystems. This complexity results from the difficulty of providing efficient power conversion close to the physical location of the MRI system RF receivers in a way that does not affect the image quality.

FIG. 1 illustrates a power distribution architecture 10 associated with a scan room power supply that is known in the art. Highly sensitive amplifiers used throughout the receiver chain of an MR system require electrically clean supplies to avoid introducing conducted/radiated noise that can have an adverse effect in the quality of an image. Noise requirements have led to the use of linear regulators 12 in the scan room power supply (SRPS). Linear regulators can be inefficient but provide very good regulation, do not introduce high frequency noise, and have a very good transient response over wide load ranges. Present scan room power supplies take power from a conventional ac line and a three-phase line transformer that steps down the voltage and rectifies it to a lower dc bus voltage. The laminations used in the low frequency transformer are ferromagnetic and cannot be located in the immediate vicinity of the main magnet.

Large amounts of wasted heat must be removed from the active devices inside a SRPS using fans and/or heat sinks due to the inefficiency of linear power supplies. The size and weight of the thermal management system required and the need to maintain the line transformer away from strong magnetic fields have constrained the location of the SRPS to the equipment room.

The distance between the SRPS and the receivers is bridged by a complex wiring architecture can have wires of up to 20 meters long. Further complicating matters is the need to provide a point of load regulation that requires the use of 4 wires per output of the SRPS: a pair of cables for power delivery and a pair of thinner wired for voltage sensing. Losses in the long wires can be significant and efforts to reduce loss by the use of heavier cables come with an increase in the cost and weight of the system.

Although switched mode power supplies are known to deliver power efficiently, certain features associated with the use of conventional SMPS designs has prevented the use of such power supplies in MRI systems. These features include, for example, the fast turn on/off transitions across SMPS switching elements that are a well known source of EMI noise. If the noise has frequency components at frequencies within the imaging signal bandwidth, the quality of the image is adversely affected. Further, conventional SMPS designs employ energy storage devices the use ferrites. These ferromagnetic materials are not suitable for operation in the vicinity of the dc magnetic field surrounding the MRI system, since subjecting ferromagnetic materials to a large magnetic field can result in saturation and loss of their magnetic properties.

In view of the foregoing, it would be advantageous to provide a SMPS that operates at a switching frequency at which any potential EMI will have frequency components falling outside the imaging bandwidth of a corresponding MRI system. The SMPS energy storage components should be robust to large magnetic fields such that the SMPS can operate in close proximity to the magnet in an MRI system without experiencing adverse effects generally associated with conventional SMPS designs.

BRIEF DESCRIPTION

Briefly, in accordance with one embodiment, a switched mode power supply (SMPS) comprises energy storage components and is configured to operate only at switching frequencies such that electromagnetic interference generated via corresponding switching frequency harmonics is generated at frequencies appearing only outside the imaging bandwidth of a corresponding magnetic resonance imaging (MRI) system powered by the SMPS.

According to another embodiment, a switched mode power supply (SMPS) comprises energy storage components and is disposed inside a corresponding magnetic resonance imaging (MRI) system scan room and configured to operate at switching frequencies such that any harmonic frequency signals generated via the SMPS are generated at frequencies appearing only outside the imaging bandwidth of the MRI system.

According to yet another embodiment, a switched mode power supply (SMPS) for a magnetic resonance imaging (MRI) system comprises:

a primary power stage; and a secondary power stage electrically coupled to the primary power stage solely via a non-ferrite energy storage component, wherein electromagnetic interference generated via corresponding SMPS switching frequency harmonics does not substantially affect image quality of the MRI system.

DRAWINGS

These and other features, aspects, and advantages of the present invention will become better understood when the following detailed description is read with reference to the accompanying drawings in which like characters represent like parts throughout the drawings, wherein.

Figure 1:
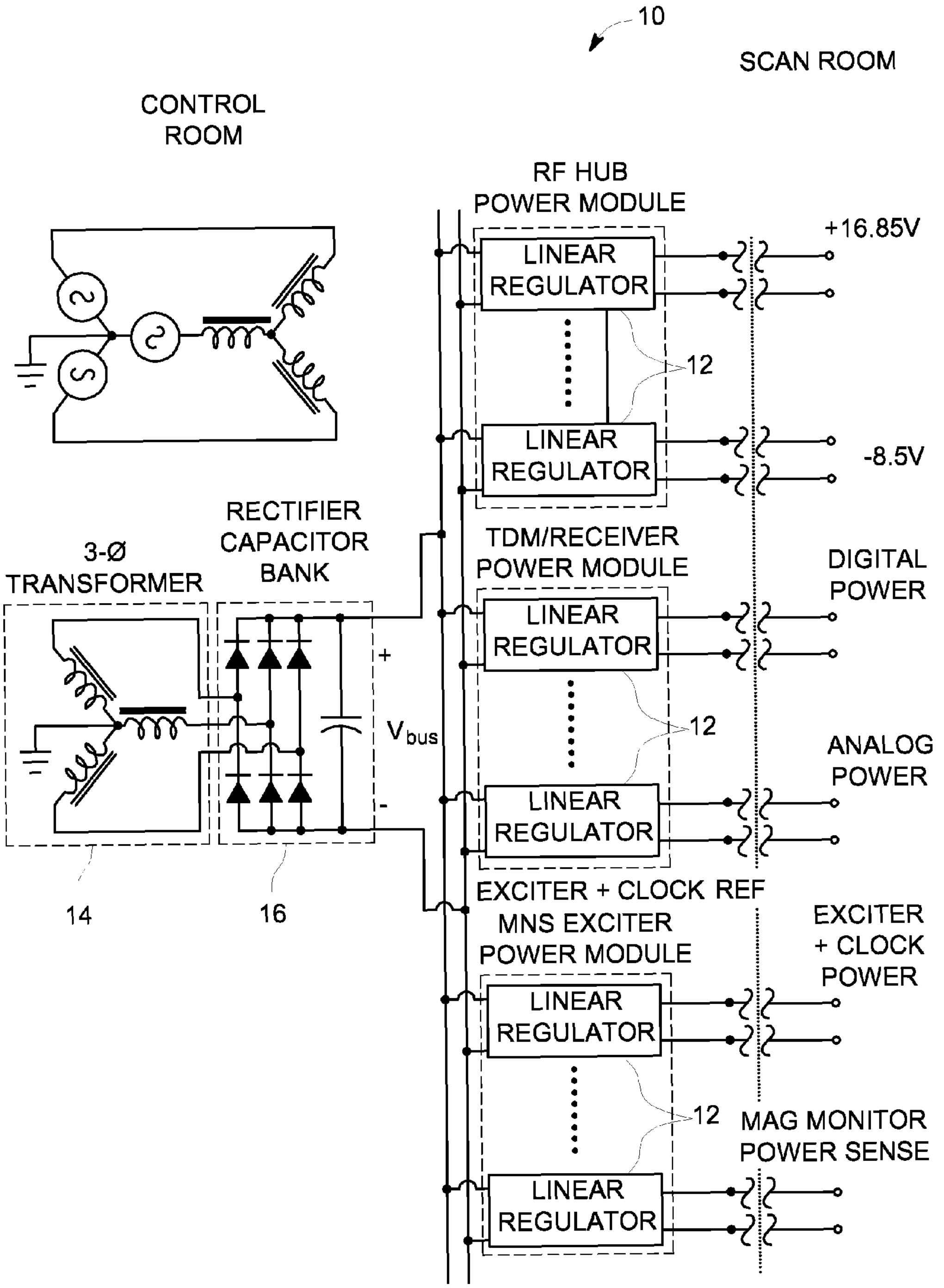
FIG. 1 illustrates a power distribution architecture associated with a scan room power supply that is known in the art.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

The embodiments described herein with reference to the figures are directed to a switched mode power supply (SMPS) capable of operation in close proximity to the main magnet in a magnetic resonance imaging (MRI) system while having no adverse effects in image quality. The power distribution architecture found in conventional MR systems has an intricate array of heavy gauge wires that supply the various voltage and current levels needed across the different subsystems. This complexity is a result of the difficulty of providing efficient power conversion close to the physical location of the RF receivers in a way that image quality is not adversely affected. The SMPS embodiments described herein exclusively use air core magnetic energy storage components and operate at a switching frequency at which any potential EMI generated via the SMPS will have frequency components falling only outside the imaging bandwidth of the MRI system. The SMPS embodiments described herein can simplify the power distribution architecture, resulting in cost reductions for MRI systems that employ the SMPS embodiments described herein.

An important characteristic of any power architecture to be use for MR, regardless of location, is the preservation of image quality, and precedes even system efficiency, cost, complexity, and the like. Switched mode power supplies are a well known source of EMI. Switching events fundamental to the supply operation lead to voltage-current waveforms with significant harmonic content. Further, device parasitics often lead to high frequency ringing and the creation of unintended paths for current flow. These can lead to potential conducted and/or radiated EMI. Important for the use of switched mode power supplies in a magnetic resonance environment is the careful selection of circuit topologies that minimize the risk of unwanted EMI. Two ways to minimize EMI potential of degrading image quality are zero voltage switching (ZVS) and careful selection of the switching frequency.

Switched mode power supplies generally use capacitors and inductors as energy storage components. Inductors employed in conventional power supplies are often constructed using a high permeability ferrimagnetic material (ferrite). The large dc magnetic field in the vicinity of the superconducting magnet (main magnet) can saturate the magnetic material. Energy storage requirements for switched mode power supplies are inversely proportional to the switching frequency. The usefulness of this feature is exploited in the embodiments described herein directed to high frequency switched mode power supplies comprising very small energy storage components such as inductors and capacitors that employ an air core. Since air core magnetic elements are not subject to saturation, they can be co-located with the MR main magnet.

Figure 2:
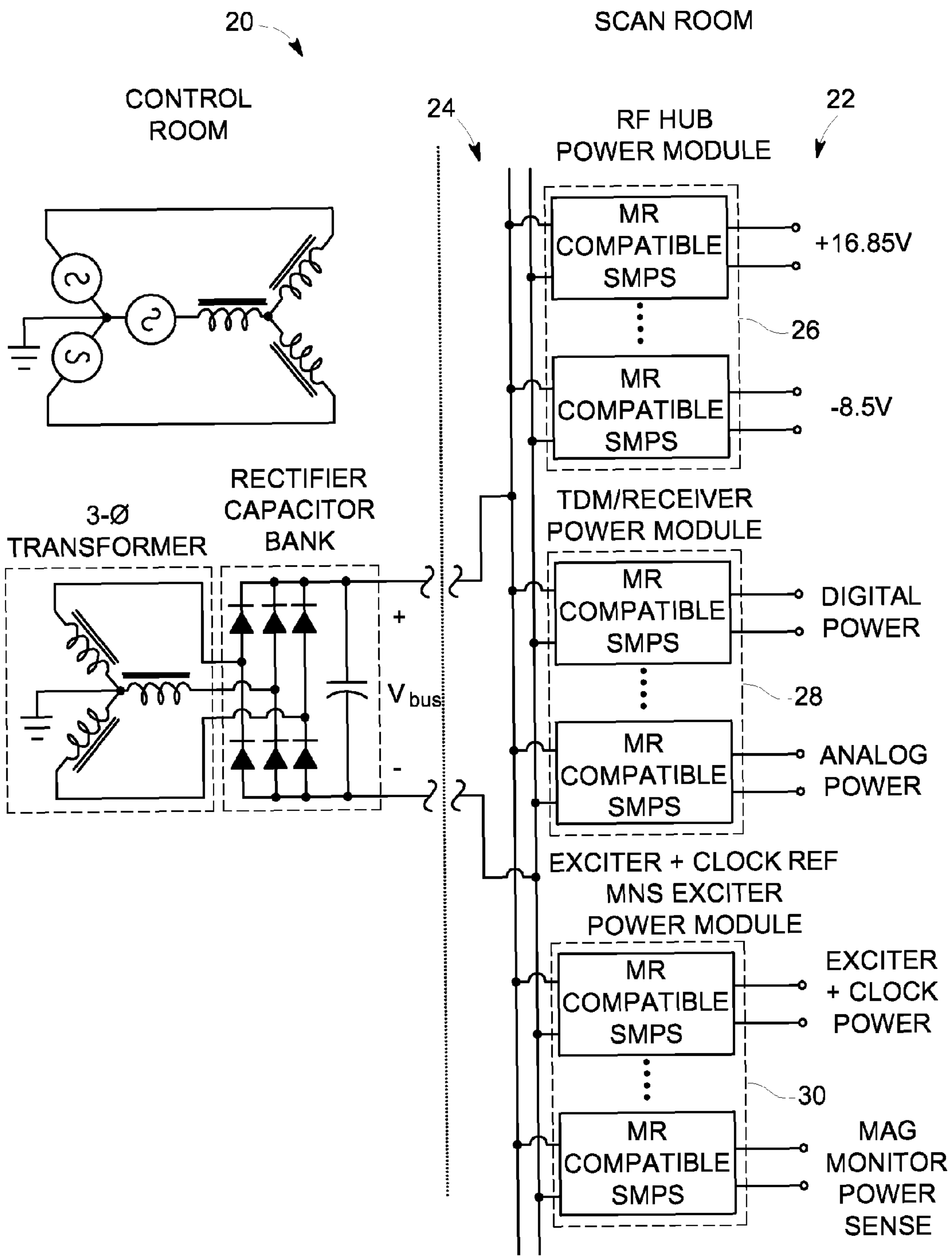
FIG. 2 illustrates a power distribution architecture associated with a scan room power supply according to one embodiment of the invention.

Keeping the foregoing concepts in mind, FIG. 2 illustrates a power distribution architecture 20 associated with a scan room power supply 22 according to one embodiment of the invention. Power distribution architecture 20 advantageously reduces the number of wires going into the scan (magnet) room 24 by using a lower number of higher voltage rails followed by multiple local voltage conversion modules located inside the scan (magnet) room 24. Each power supply module 26, 28, 30 brings the bus voltage down to the value required by each corresponding subsystem. This use of local conversions blocks with switched mode power supplies advantageously achieves higher efficiencies than that achievable using linear regulators for large output/input voltage ratios such as depicted in FIG. 1. The sensitivity of the MR system and the presence of a very large dc magnetic field inside the magnet room 24 impose several challenges to the possible use of switched mode power supplies, as stated herein. These challenges include, without limitation, EMI noise. Switching transitions, fundamental to the operation of switched mode power supplies, carry energy having frequency components extending to very high frequencies. This energy can result in EMI issues affecting the image quality. Further, conventional power electronics systems use energy storage elements commonly implemented with inductors and capacitors. Inductors are usually made by winding a magnet wire around a core having very particular magnetic properties. Most cores are mode of iron (power or laminated) or ferrites. When subjected to large magnetic fields, these material can saturate and lose their magnetic properties.

The embodiments described herein with reference to the figures overcome the foregoing challenges by providing power distribution architectures for MR systems with the potential to dramatically simplify the wiring of the receiver chain of the system. The embodiment depicted in FIG. 2 comprises MR compatible switched mode power supplies that can be placed near or next to the main magnet and addresses the EMI issue by switching at a frequency that minimizes potential image artifacts.

Figure 3:
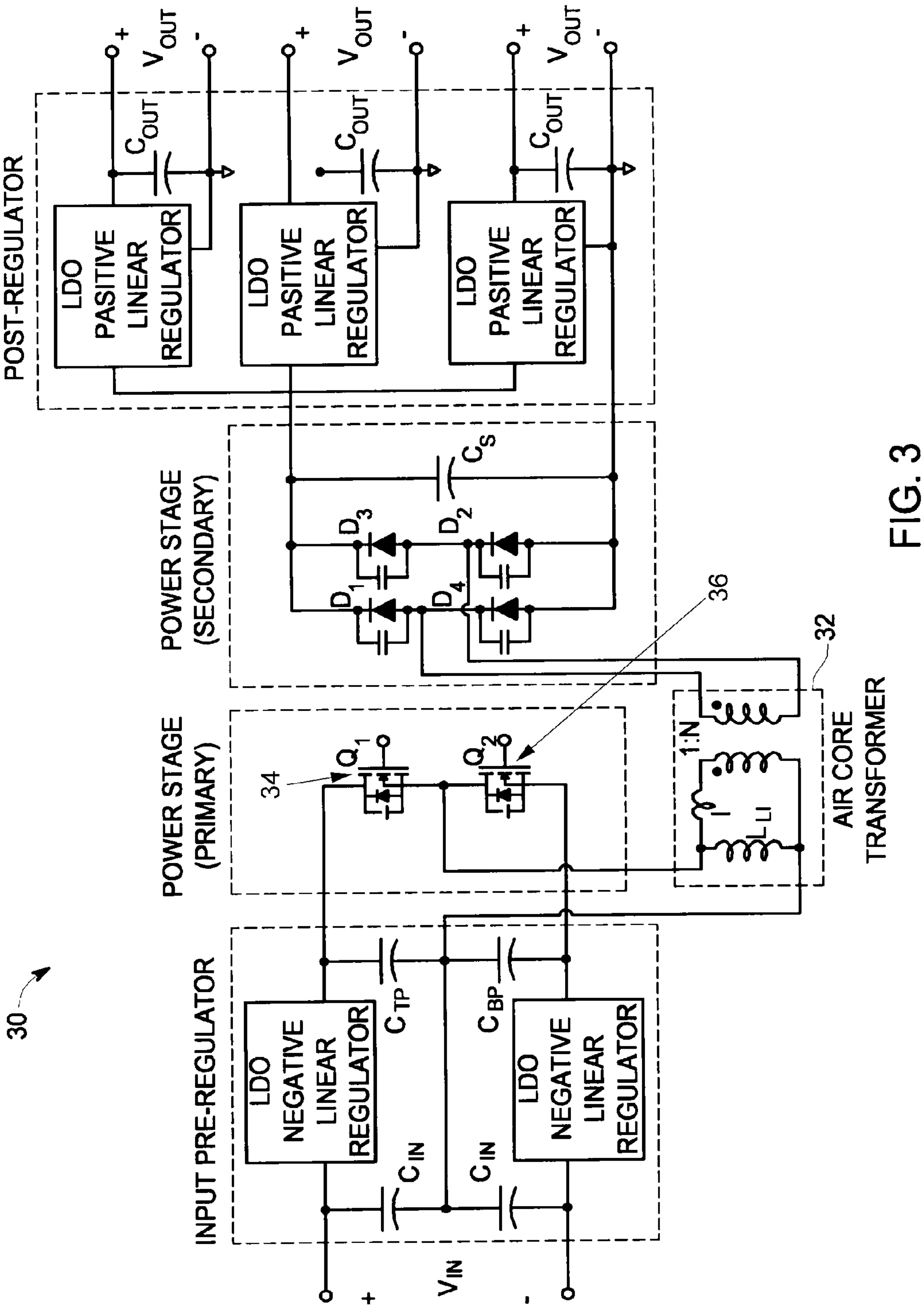
FIG. 3 is a schematic diagram illustrating a SMPS that employs an air core transformer according to one embodiment of the invention.

FIG. 3 is a schematic diagram illustrating a SMPS 30 that employs an air core energy storage component 32 and that is suitable for use to implement the power distribution architecture shown in FIG. 2, according to one embodiment of the invention. Switched mode power supply 30 exclusively employs energy storage components that are devoid of ferromagnetic or ferrimagnetic materials. Further, SMPS 30 is configured to operate at a switching frequency at which any potential EMI will have frequency components falling only outside the imaging bandwidth of the system that is powered by the SMPS 30. According to one embodiment, SMPS 30 operates at a switching frequency higher than that employed via conventional MRI power supplies that may also be switched mode power supplies. More specifically, the SMPS 30 is carefully selected to ensure that all resulting harmonics (potential sources of EMI noise) are at frequencies that do not affect image quality. At frequencies where this is possible, the energy storage requirements of the SMPS 30 are such that air core components can be exclusively employed. The exclusive use of air core energy storage components allows placement of the SMPS 30 in close proximity to the magnet in a corresponding MR system utilizing the SMPS 30. A plurality of switching elements 34, 36 can be seen in FIG. 3 to control the SMPS 30 switching frequency of energy transfer associated with the air core energy storage component 32. Providing efficient power conversion near the corresponding amplifiers results in substantially reduced wiring complexity when compared to more conventional power conversion techniques presently employed in the relevant art.

SMPS 30 advantageously eliminates EMI noise generally associated with conventional switched mode power supplies that affect image quality. SMPS 30 further eliminates the saturation problems generally associated with placement of convention switched mode power supplies in close proximity to the MR magnet.

Other advantages provided by SMPS 30 include elimination of the need to large heat sinks generally associated with linear regulators due to lack of efficiency. These large heat sinks disadvantageously require forced cooling with fans that cannot be placed near the MR magnet. Further, SMPS 30 allows feeding of higher voltages into the magnet room, thus substantially reducing the number of wires required for distributing power to the amplifiers, and thus substantially reducing the system cost.

The SMPS 30 architecture advantageously reduces the power consumed by the receiver chain of the corresponding MR system by boosting power delivery efficiency; and since a rack of equipment currently located within an annex room to the machine can be placed and distributed inside the magnet room, the system footprint can be substantially reduced. SMPS 30 further is scalable, a feature useful to accommodate module specific power requirements. SMPS 30 can thus be modularized for use as a DC-DC building block suitable for use with other in-room electronic modules.

Switching power supplies have generally been placed outside the magnet room in an effort to improve power efficiency and lower costs. Shielding and significant filtering have been required to avoid affecting image quality. Such remedies often are inadequate, and artifacts remain. Switching power supplies located away from the load still must output the low voltages and high currents required by the corresponding loads. Thus, cable bulk and conduction loss inefficiencies also remain in such environments.

Figure 4:
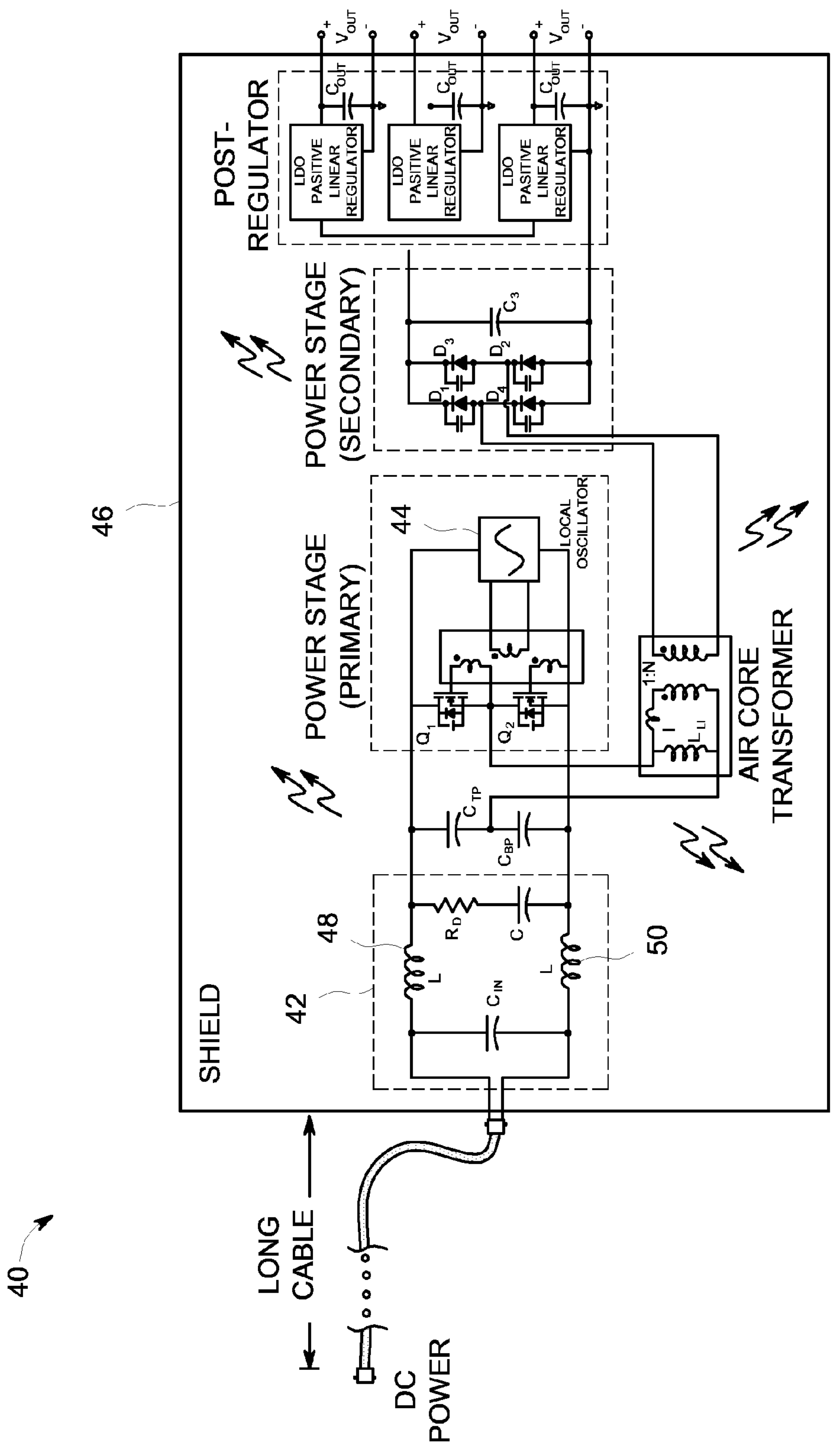
FIG. 4 is a schematic diagram illustrating a SMPS that employs EMI shielding and a high order input filter according to one embodiment of the invention.

FIG. 4 is a schematic diagram illustrating a SMPS 40 that employs EMI shielding and a high order input filter according to one embodiment of the invention. SMPS 40 mitigates radiation of HF components in three ways including 1) use of a high order input filter 42 to attenuate input current ripple, 2) use of a local oscillator circuit 44 to drive the MOSFET gates sinusoidaly which helps to reduce spurious oscillation at the MOSFET's gate, and 3) use of a metal case 46 to shield the SMPS 40. Splitting the input filter inductor in two (one per line as shown) 48, 50, provides a high impedance for common mode components. The damping leg 52 prevents un-wanted oscillations. Parasitic elements do have some detrimental effects regarding high frequency performance of the filter 42. Although a multi-stage filter may extend the usable frequency range of the input filter 42, the present inventors found careful selection of the switching frequency to provide the most workable solution.

Figure 5:
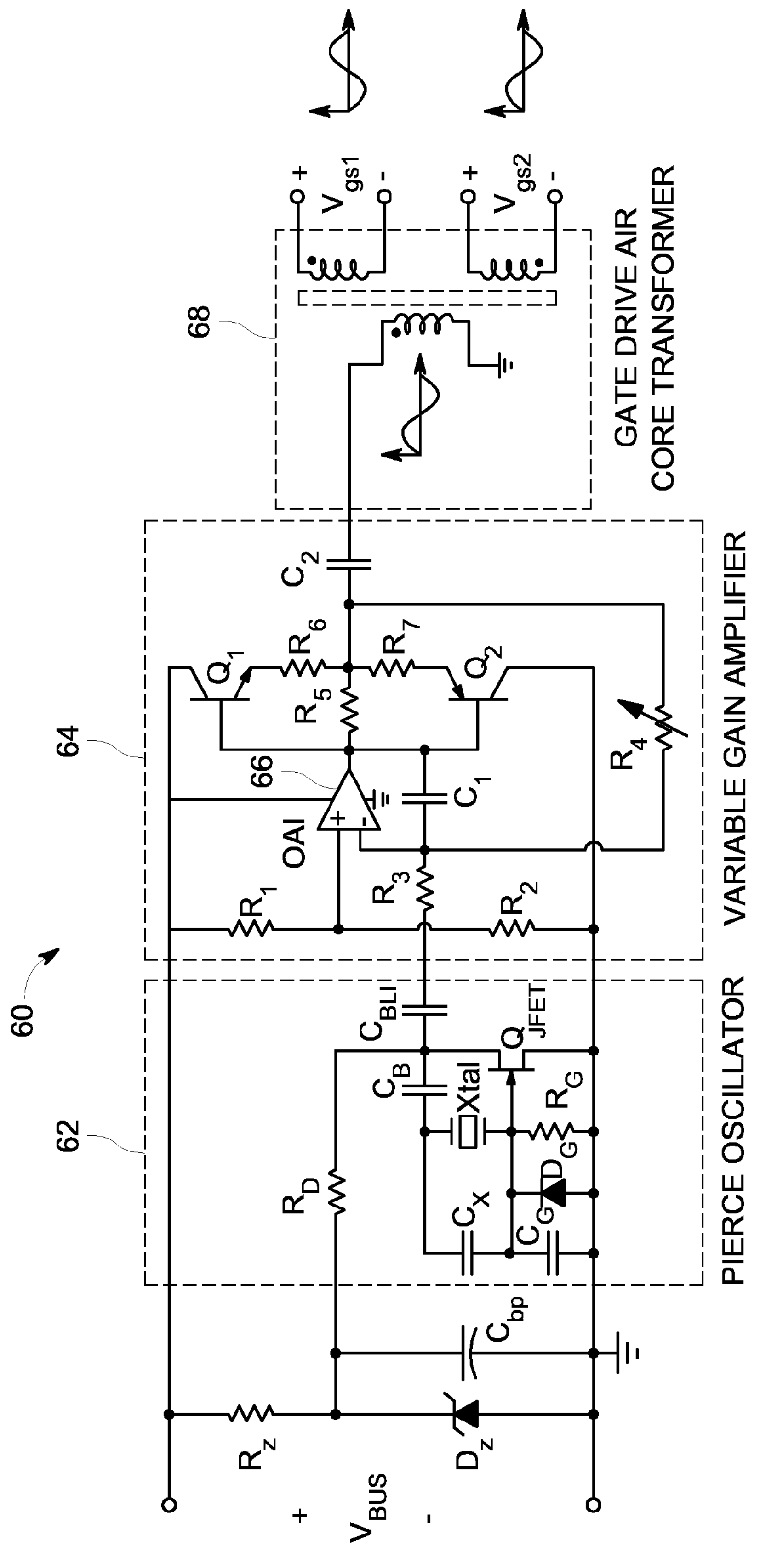
FIG. 5 is a diagram illustrating a local sinusoidal gate drive circuit for a SMPS that employs an air core transformer according to one embodiment of the invention.

FIG. 5 is a diagram illustrating a local sinusoidal gate drive circuit 60 suitable for implementing the local oscillator circuit 44 depicted in FIG. 4 that drives the air core transformer 68 according to one embodiment of the invention. Local sinusoidal gate drive circuit 60 employs a quartz crystal Pierce oscillator 62 that generates a stable sinusoidal signal at the desired frequency.

Figure 6:
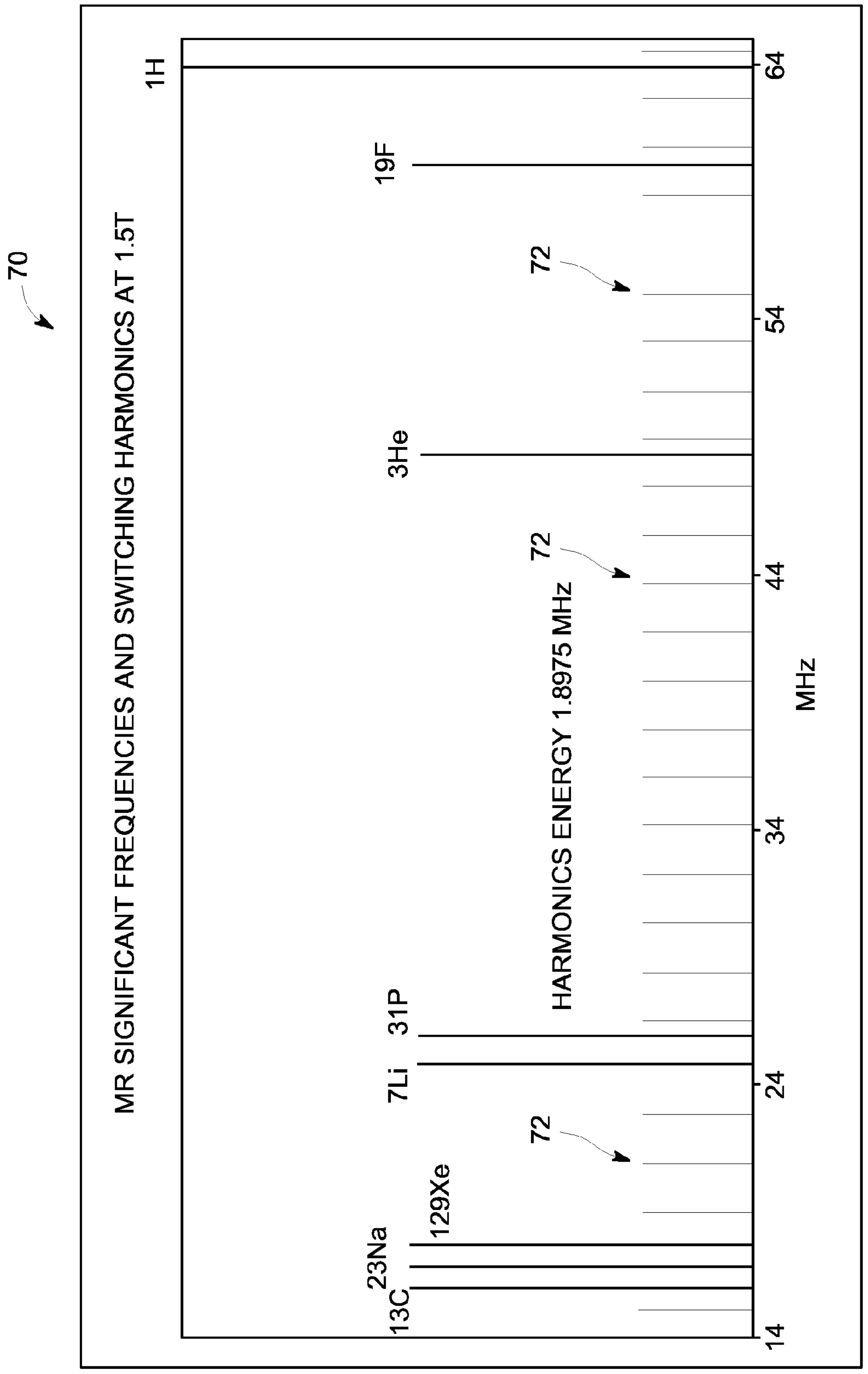
FIG. 6 is a graph illustrating switching harmonics generated with a SMPS that is devoid of ferrimagnetic components according to one embodiment of the invention.

FIG. 6 is a graph 70 illustrating switching harmonics 72 generated with a SMPS that is devoid of ferromagnetic and ferrimagnetic components and that operates at a switching frequency of 1.8975 MHz+/−0.18% according to one embodiment of the invention. When operating at 1.8975 MHz, the SMPS generates harmonics at 1.8975 MHz frequency intervals which do not conflict with MR nuclei of interest in 1.5 T and 3.0 T MRI systems. Thus, since switching harmonics occur at integer multiples of the switching frequencies, and the Lamor frequencies of relevant nuclei are constrained to very specific values, a SMPS operating at a switching frequency of 1.8975 MHz generates no adverse effects on image quality for 1.5 T and 3.0 T MRI systems.

In summary explanation, a switched mode power supply is implemented exclusively using only energy storage components devoid of ferromagnetic/ferromagnetic (ferrite) materials and is configured to operate at switching frequencies such that any potential electromagnetic interference is generated at frequencies appearing only outside the imaging bandwidth of a corresponding magnetic resonance imaging system powered by the switched mode power supply. Since the SMPS is devoid of energy storage components using ferromagnetic/ferrimagnetic materials, the SMPS can be placed in close proximity to the main magnet in a MRI system without causing adverse effects in image quality and without experiencing degradation of SMPS performance.

The switching frequency of MR compatible switched mode power supplies is selected to ensure that none of the switching frequency harmonics land on frequencies used for images. This selected switching frequency is high enough to allow the use of air-core energy storage elements. In the frequency range from about 1.5 MHz to about 2 MHz for example, there are few possible operating frequencies that meet such criteria (i.e., 1.757 MHz and 1.8975 MHz). As the frequency increases, there are more and more possible frequencies that are MR compatible. One such SMPS embodiment that employs air core inductors operates for example, at about 27.12 MHz. The maximum operating frequency is dependent upon parasitic elements in semiconductors, and upon the difficulties associated with modeling and accounting for all parasitics on a PC board.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A magnetic resonance imaging system (MRI) compatible switched mode power supply (SMPS) comprising:

at least one energy storage component; and a plurality of switching elements for controlling a switching frequency of energy transfer associated with the at least one energy storage component, wherein all SMPS energy storage components are air core energy storage components, and further wherein MRI system electromagnetic interference (EMI) generated by switching frequency harmonics associated with the switching frequency of energy transfer appear at frequencies only outside a predetermined MRI signal bandwidth during operation of the SMPS.

2. The SMPS according to claim 1, wherein the SMPS at least one energy storage component is devoid of ferromagnetic materials.

3. The SMPS according to claim 1, wherein the SMPS at least one energy storage component is devoid of ferrimagnetic materials.

4. The SMPS according to claim 1, wherein the EMI frequencies comprise other than Lamor frequencies of predetermined nuclei of interest.

5. The SMPS according to claim 1, wherein the MRI system is selected from a 1.5 T system, a 3.0 T system, and combinations thereof.

6. The SMPS according to claim 1, wherein the SMPS is disposed within an MRI system magnet room.

7. The SMPS according to claim 1, wherein the at least one storage component comprises at least one of an air core transformer, an air core inductor, and combinations thereof.

* * * * *